(12) United States Patent
Ulm

(10) Patent No.: US 6,308,121 B1
(45) Date of Patent: Oct. 23, 2001

(54) ELECTRONIC CONTROL UNIT, IN PARTICULAR FOR A DEVICE PROVIDED IN A MOTOR VEHICLE

(75) Inventor: Michael Ulm, Alteglofsheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 08/935,622

(22) Filed: Sep. 23, 1997

(30) Foreign Application Priority Data

Sep. 23, 1996 (DE) .............................................. 196 38 973

(51) Int. Cl.$^7$ ................................. G06F 7/70; G06G 7/76
(52) U.S. Cl. ................................... 701/35; 701/29; 701/33
(58) Field of Search .................................. 701/29, 33, 102, 701/35, 114, 115; 340/438, 439, 436, 945, 959, 588; 123/479; 73/117.4, 116

(56) References Cited

U.S. PATENT DOCUMENTS

| 4,181,944 | 1/1980 | Yamauchi et al. | 701/101 |
| 5,276,619 * | 1/1994 | Chara et al. | 701/35 |
| 5,379,219 * | 1/1995 | Ishibashi | 701/35 |
| 5,428,542 * | 6/1995 | Liesveld | 701/35 |
| 5,500,797 * | 3/1996 | Noger | 701/35 |
| 5,581,462 * | 12/1996 | Rogers | 701/35 |
| 5,687,149 | 11/1997 | Meunier | 369/54 |

FOREIGN PATENT DOCUMENTS 0 635 785 A1  1/1995  (EP) .

* cited by examiner

Primary Examiner—Jacques H. Louis-Jacques
(74) Attorney, Agent, or Firm—Herbert L. Lerner; Laurence A. Greenberg; Werner H. Stemer

(57) ABSTRACT

A control unit, in particular for a device provided in a motor vehicle, has a computer, a first volatile data memory and a second nonvolatile data memory connected to a temperature sensor. During operation, variable data are transmitted from the first to the second data memory. Information regarding the temperature of the nonvolatile data memory is supplied by the temperature sensor to the computer. Data from the volatile data memory are copied to the nonvolatile data memory only when the temperature that has been signaled falls below a predetermined value. Data are read from the nonvolatile data memory up to an upper temperature limit which lies above the predetermined value.

9 Claims, 7 Drawing Sheets

ELECTRONIC CONTROL UNIT, IN PARTICULAR FOR A DEVICE PROVIDED IN A MOTOR VEHICLE

BACKGROUND OF THE INVENTION

Field of the Invention

The invention relates to an electronic control unit, in particular for a device provided in a motor vehicle, including a computer, a first data memory and a second data memory connected to a temperature sensor, wherein data are transmitted from the first to the second data memory.

Such a control unit is disclosed in U.S. Pat. No. 4,181,944, for example.

Modern electronic control units are increasingly being fitted to actuators to be controlled or integrated in them. In the field of motor vehicle technology, the following may be mentioned as examples of such control units: Transmission controllers integrated in transmissions (so-called Prodmod transmission controllers), integrated hydraulic and electronic systems and engine controllers installed in internal combustion engines.

As a result of attaching the control units to the mechanical and hydraulic devices in that way, the electronic circuits are subjected to increased stresses, in particular to higher temperatures, due to their environment. Thus, for example, temperatures of up to 140° C. or more may occur in automatic transmissions. The meaning thereof is that the electronic components have to be operated right up to the limits of their technical specifications.

Those components that are stressed to a greater extent include, in particular, electrical program and data memories, to which type-specific data and adaptive values of the control unit (for example learning values for wear compensation) are written and which must ensure protected management of such data. Examples of such memory modules are EEPROM and flash modules. Their task is to store variable data (for example learning values, diagnostic information, fault memory contents or calibration values) even when the control unit is disconnected from its supply voltage.

SUMMARY OF THE INVENTION

It is accordingly an object of the invention to provide an electronic control unit, in particular for a device provided in a motor vehicle, which overcomes the hereinafore-mentioned disadvantages of the heretofore-known devices of this general type and which still operates reliably under relatively high ambient loading, especially at higher temperatures. In particular, electrically erasable memory modules contained in the control units are intended to reliably store data written to them.

With the foregoing and other objects in view there is provided, in accordance with the invention, an electronic control unit, in particular for a device provided in a motor vehicle, comprising a first volatile data memory; a second nonvolatile data memory for receiving and storing variable data from the volatile data memory; a temperature sensor supplying information signaling a temperature of the nonvolatile data memory; and a computer receiving the temperature information from the temperature sensor, the computer copying data from the volatile data memory to the nonvolatile data memory only when the temperature signaled by the temperature sensor falls below a predetermined value, and data being read from the nonvolatile data memory up to an upper temperature limit lying above the predetermined value.

In accordance with another feature of the invention, the data are copied cyclically from the volatile data memory to the data memory during normal operation of the control unit.

In accordance with a further feature of the invention, there is provided a switch to be opened by a user of the electronic control unit for enabling the computer to copy data from the volatile data memory to the nonvolatile data memory.

In accordance with an added feature of the invention, there is provided a supply voltage source, the volatile data memory having an operating voltage input connected to the supply voltage source, and a switch opened by the computer after copying has taken place or if a signal of the temperature sensor has exceeded the predetermined value.

In accordance with an additional feature of the invention, the switch is subsequently closed for suppressing copying of values back from the nonvolatile data memory to the volatile data memory.

In accordance with yet another feature of the invention, the predetermined value corresponds to a maximum permissible erasure and writing temperature for the nonvolatile data memory.

In accordance with a concomitant feature of the invention, there is provided an internal operating voltage supply; an operating voltage input of the volatile data memory connected to the operating voltage supply; a supply voltage source for the computer and if appropriate for the volatile data memory and the nonvolatile data memory; and a switch connected to the computer and to the supply voltage source for internally disconnecting the supply voltage source with a command from the computer and if appropriate internally disconnecting the supply voltage source from the volatile data memory and the nonvolatile data memory with a command from the computer; the computer opening the switch after the temperature signaled by the temperature sensor has fallen below the predetermined value and after the data have been copied from the volatile data memory to the nonvolatile data memory.

Other features which are considered as characteristic for the invention are set forth in the appended claims.

Although the invention is illustrated and described herein as embodied in an electronic control unit, in particular for a device provided in a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
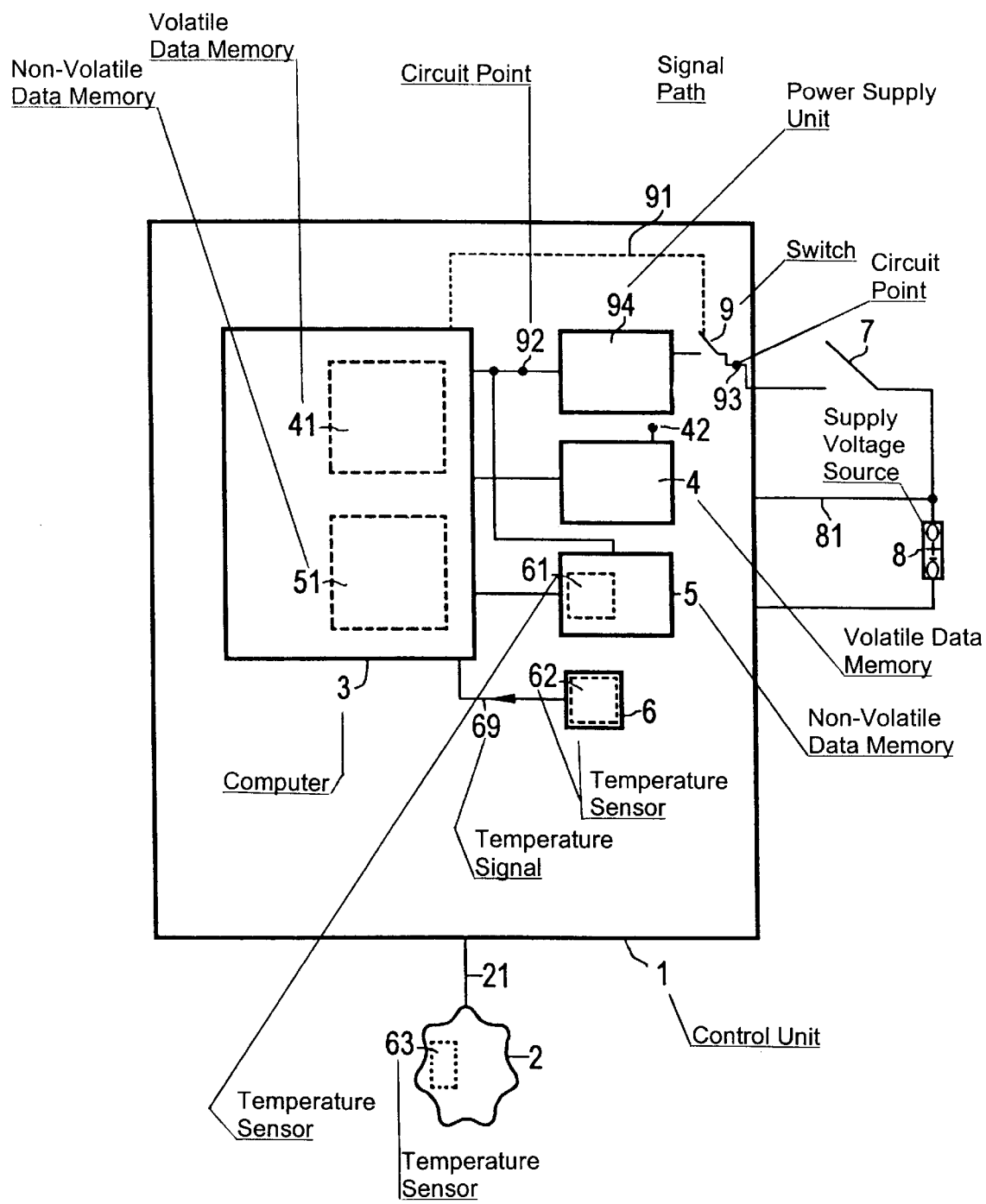
FIG. 1 is a block circuit diagram of an electronic control unit according to the invention.

Referring now to the figures of the drawings in detail and first, particularly, to FIG. 1 thereof, it is seen that once an electronic control unit 1 has been installed, it resides in an environment which is distinguished, in particular, by prevailing temperatures, thermal capacities and heat flows, as is indicated symbolically herein by a line 2 representing that environment. A line 21 symbolizes a structural attachment of the control unit 1 to its environment 2 with a defined heat transfer. It is assumed in this case that the temperature of the control unit 1 and thus the temperature of electrical and electronic modules contained therein essentially correspond to the ambient temperature due to the attachment 21 that conducts heat well. This assumption applies, for example, to control units installed in a motor vehicle.

The control unit 1 contains a computer 3, for example in the form of a microcontroller, a volatile data memory 4, a further volatile data memory 41 if appropriate and a nonvolatile data memory 5. The meaning of the property "volatile" is that the memory content of that data memory is lost when that memory is disconnected from its operating voltage. As a rule, the memories 4 and 41 are constructed as RAM modules.

Depending on the respective application, the volatile data memory is integrated (in the case of the data memory 41) in the computer 3 or not integrated (in the case of the data memory 4). The meaning of the property "nonvolatile" in this case is that the memory content of the data memory 5 is not lost when that memory is disconnected from its operating voltage. The nonvolatile data memory 5 may, for example, be a flash memory which can be erased in a block-by-block manner, or an EEPROM module which can be erased in a byte-by-byte or word-by-word manner. The nonvolatile data memory 5 also has the (intrinsically negative) property that it must run through a time-consuming erase operation before it can be written to. Such an erase operation cannot be carried out during normal operation of the control unit 1.

In addition to at least one data memory, the control unit 1 which is provided with the computer or microcontroller 3 also contains a program memory that is provided in a generally customary manner and contains a program to be processed by the computer 3. This program memory is not described any further herein since it is generally known and unaffected by the invention. The program memory may be contained together with the nonvolatile data memory 5 on a chip, for example in the form of a flash memory which is organized in a block-by-block manner. A further nonvolatile data memory 51 may alternatively be integrated in the computer 3.

A temperature sensor 6 detects the temperature of the nonvolatile data memory 5 and, if appropriate, of the further nonvolatile data memory 51.

The temperature sensor may also be constructed as a temperature sensor 61 that is integrated in the nonvolatile data memory 5. The temperature sensor may furthermore be constructed as a temperature sensor 62 which is integrated in the electronic control unit 1, for example by being disposed on a hybrid substrate on which the computer 3 and the data memories 4 and 5 are also located. Finally, the temperature sensor may also be constructed as a temperature sensor 63 which is disposed outside the control unit but is thermally coupled to the nonvolatile data memory 5. A (temperature) signal 69 is emitted from the respective temperature sensor to the computer 3 and is evaluated by the latter.

A supply voltage, which is supplied by a supply voltage source 8, is applied to the control unit or disconnected from the latter through the use of a switch 7. In a motor vehicle, the switch 7 is generally the ignition lock switch and the supply voltage source 8 is the automobile battery. Moreover, the supply voltage is applied to the control unit through a lead 81 in such a way that it can only be disconnected internally within the control unit, and not from outside the control unit.

A switch 9 contained in the control unit serves to disconnect the operating voltage of the computer 3 and, if appropriate, of the volatile data memory 4 and of the nonvolatile data memory 5 internally within the control unit through the use of a program command of the computer 3. The disconnection is effected through a signal path 91.

Since the control unit supply voltage, which is present at a circuit point 92 FIG. 1, is 12V and the operating voltage for the components 3, 4, 5, which is present at a circuit point 93, is 5V, a voltage regulator or power supply unit 94, which correspondingly reduces the voltage, is inserted between these two circuit points.

The task of the nonvolatile electrically erasable data memories 5 and/or 51 in a motor vehicle is to retain variable data (learning values, diagnostic information, in other words fault memory contents or calibration values, etc.) even when the control unit 1 is removed from the battery or voltage supply 8. For this purpose, the data are written to the nonvolatile data memory during or after a travel cycle (i.e. after the ignition has been switched off). In the following text, no distinction is made between an EEPROM (that is to say a data memory which can be erased and rewritten to in a byte-by-byte or word-by-word manner) and a flash (that is to say a data memory which can be erased in a block-by-block manner), since the byte-by-byte or word-by-word programmability of a flash memory can be simulated with suitable algorithms.

Reliable functioning of these electrically erasable data memories 5, 51 depends critically on the operating temperature of the data memory and thus essentially on the ambient temperature of the electronic control unit 1. The specifications of data memories usually contain a maximum operating temperature value at which the data memory is permitted to be read out, erased and rewritten to. That maximum permissible value is upwardly limited by subfunctions "erase" and "write" of the data memory. An example is a type 29F010 flash memory module from the company AMD, having a memory capacity of 128 kbytes and a maximum permissible temperature of 125° C. for writing in and erasing data. That temperature is referred to below as the "maximum temperature value" $T_{max}$.

A more meticulous investigation has established that those data memories can be read out at temperatures higher than the specified temperatures. The upper temperature limit at which it is still possible to read data from the nonvolatile data memories 4, 41 is referred to as the maximum reading temperature $T_{m,read}$. As a result, it becomes possible to operate electronic control units containing electrically erasable data memories at higher operating temperatures than heretofore in devices or apparatuses in which such elevated temperatures occur. A value which is proven in practice for the maximum reading temperature $T_{m,read}$ is 140 to about 150° C.

When the memory 4 or 5 is mentioned in this case for the sake of simplicity, the respective memories 4 and/or 41 or 5 and/or 51 are meant.

Fault memory contents or learning values (=adaptive values) determined by a control unit 1 are usually stored in memories and renewed in the following manner: When the control unit 1 is switched off through the use of the switch 7 (corresponding to the driver switching off the ignition in a motor vehicle), previously learned values which have been stored or modified in the volatile data memory 4 during the learning operation are copied by the computer or microcontroller 3 from the volatile data memory 4 to the nonvolatile data memory 5. Afterwards, the microcontroller 3 disconnects the operating voltage, through the use of the internal switch 9, from all internal loads within the control unit, that is to say from itself, from the volatile data memory 4, from the nonvolatile data memory 5 and, if appropriate, from other internal loads (which are not relevant in this case). This is done in order not to load the voltage source 8 any further (in the case of an automobile battery, non-disconnection might lead to complete discharge and thus to a vehicle breakdown, given a relatively lengthy period when the vehicle is not used).

When the control unit 1 is switched on through the use of the switch 7 (corresponding to the driver switching on the ignition in a motor vehicle), in an initialization phase the learned values which are protected in the nonvolatile data memory 5 are copied back again by the microcontroller 3 from the nonvolatile data memory 5 to the volatile data memory 4. Afterwards, during normal operation of the control unit 1, these values can again be modified by the microcontroller 3 in the volatile data memory 4, for example in a learning mode.

What is essential is that the copying of data from the volatile data memory 4 to the nonvolatile data memory 5 by the microcontroller 3 be effected while taking account of the signal 69 supplied by the temperature sensor 6. This ensures that the maximum permissible erasure and writing temperature $T_{max}$ for the nonvolatile data memory 5 is not exceeded and, consequently, the reliability of this memory is not impaired.

The use according to the invention, that is to say the write-in, amendment and read-out, of data to be stored in nonvolatile data memories, is explained below with reference to FIG. 2. The program which is illustrated is part of a superordinate program that is processed as intended in the control unit 1. If this program reaches a start point A, an interrogation is made in a step S1 to see whether or not the temperature signal 69 is lower than a predetermined limit $T_{max}$. If this is not the case, the superordinate program is continued with a step S4, which is not of interest in this case.

If the temperature signal 69 is lower than the limit, then the microcontroller 3 copies the values from the data memory 4 to the data memory 5. Afterwards, the superordinate program is continued with a step S3. The copying of the values from the data memory 4 to the data memory 5 is therefore dependent on the signal 69, which is supplied by the temperature sensor 6 and reproduces the temperature of the nonvolatile data memory 5 (or else 51).

The copying of data from the volatile data memory 4 (or 41) to the nonvolatile data memory 5 (or 51) is carried out cyclically by the computer 3, that is to say it is effected continually during normal operation of the control unit 1 within the framework of the superordinate program.

A first variant of the control unit program described above resides in the fact that the copying of values of the volatile data memory 4 (or 41) to the nonvolatile data memory 5 (or 51) by the computer 3 is carried out only after the user of the control unit 1 has opened the switch 7 (switched off the ignition in the motor vehicle). (In FIG. 3, this opening of the switch is indicated by a small box 7a.)

Figure 2:
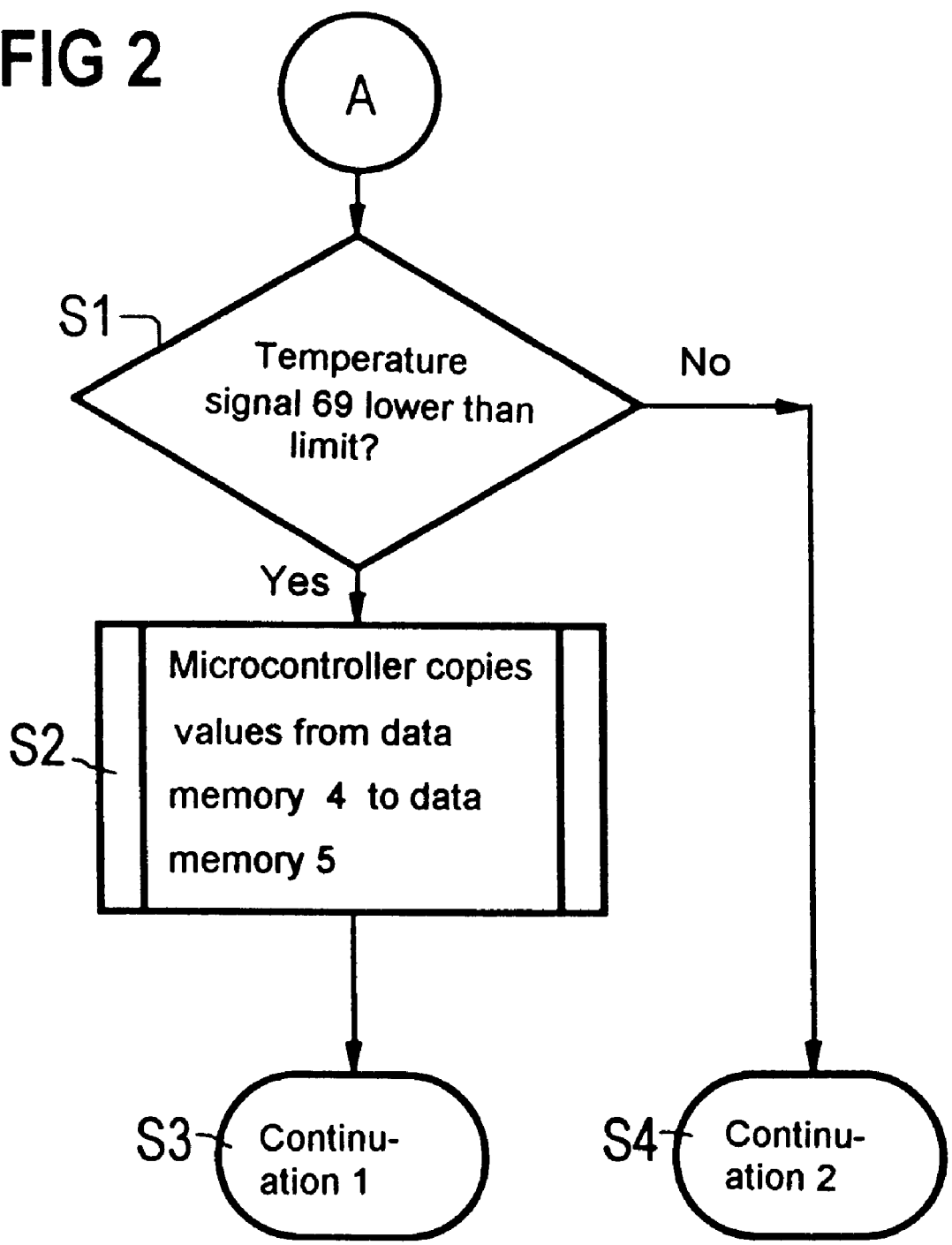
FIG. 2 is a flow diagram showing a program which is processed by the control unit according to FIG. 1.
Figure 3:
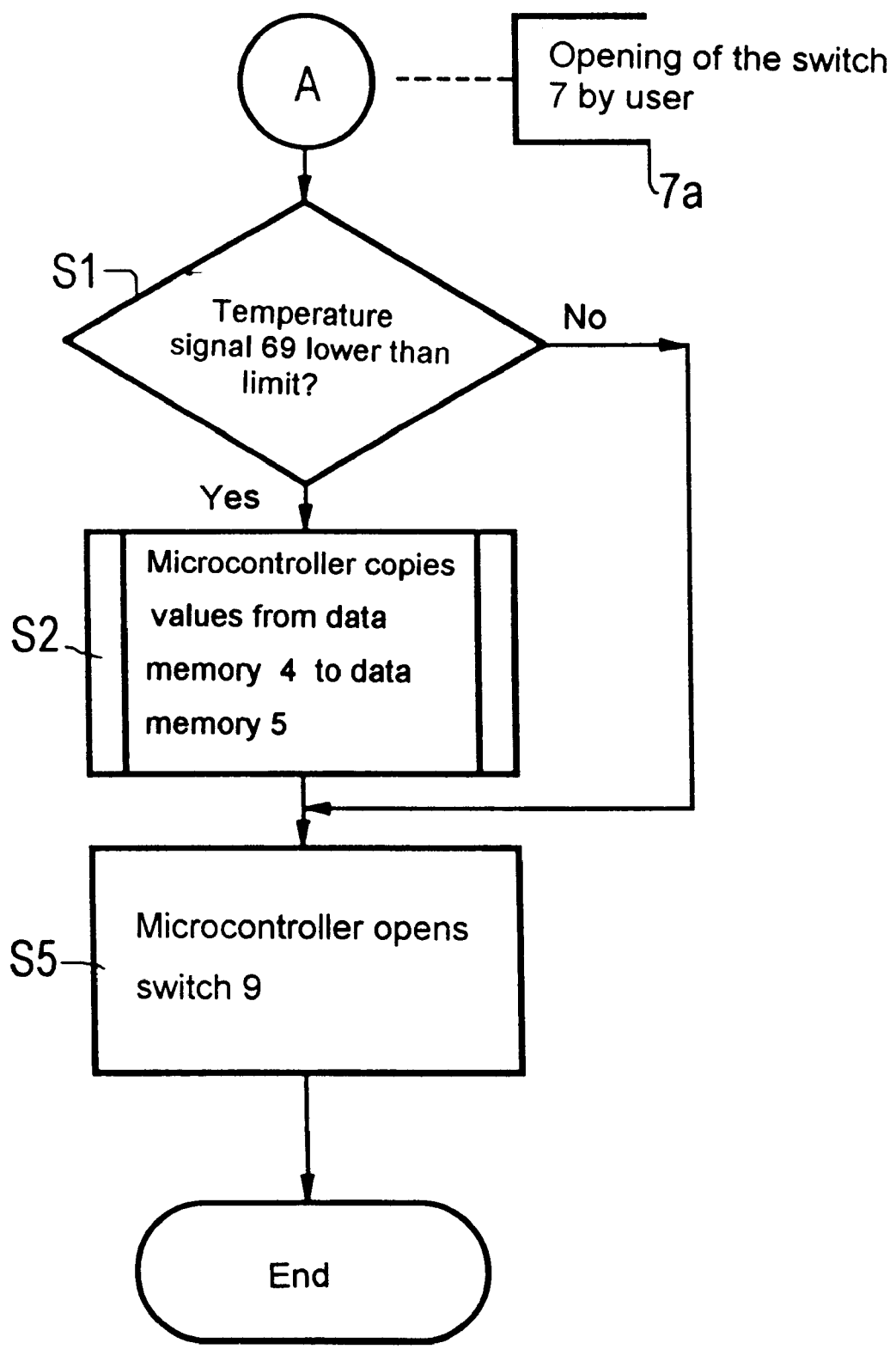
FIGS. 3–7 are flow diagrams showing further exemplary embodiments of programs which are processed by the control unit according to FIG. 1.

In a further exemplary embodiment of the invention which is illustrated in FIG. 3, the steps S1 and S2 correspond to those of FIG. 2. An operating voltage input 42 of the volatile data memory 4 which is shown in FIG. 1 is connected to an operating voltage supply at the point 92, which is connected internally within the control unit, and, in a step S5, which follows the step S1 in the event of a negative reply and otherwise follows the step S2, the computer 3 opens the switch 9 after the copying of data has taken place. However, if the signal 69 of the temperature sensor 6 exceeds the predetermined value $T_{max}$, then the computer 3 opens the switch 9 immediately. In this case, the learning routes which were altered in the last travel cycle may be lost if the temperature of the chip on which the nonvolatile data memory 5 is situated is too high. However, this is acceptable for many applications.

Figure 4:
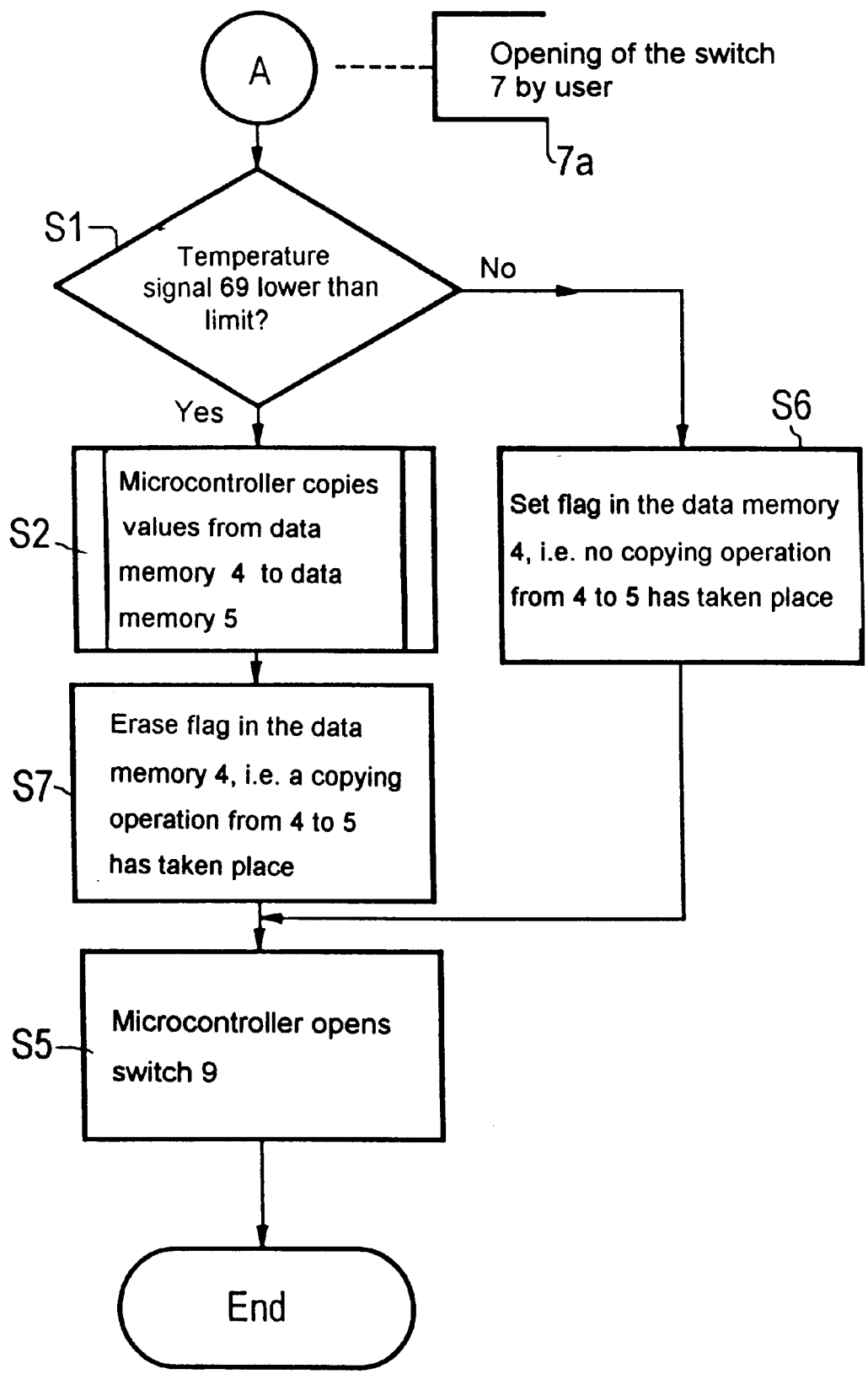

In another exemplary embodiment of the control unit 1 that is shown in FIG. 4, the operating voltage input 42 of the volatile data memory 4 is permanently connected to the supply voltage source 8 (i.e. to the circuit point 93), that is to say it is disconnected neither internally within the control unit nor externally (it is connected to a positive pole of a battery, for example, in a motor vehicle). The step S1 corresponds to the interrogation in the previous exemplary embodiments. After the data have been copied from the data memory 4 to the data memory 5 in the step S2, the computer 3 opens the switch 9 in the step S5. Moreover, it opens the switch immediately if the signal 69 of the temperature sensor exceeds the predetermined value $T_{max}$. The next time that the switch 7 closes, copying of the values back from the nonvolatile data memory 5 to the volatile data memory 4 is suppressed. For this purpose, if the interrogation S1 is answered in the negative, a flag is set in the data memory 4 in a step S6. The flag records that no copying operation from the data memory 4 to the data memory 5 has taken place.

If the interrogation S1 is answered in the affirmative, then after the step S2, which has already been described, this flag in the data memory 4 is erased in a step S7. After the step S5, which has already been described and in which the microcontroller 3 opens the switch 9, the program has reached its end. This program execution has the advantage of ensuring that stored learning values are not lost even when the chip temperature of the nonvolatile data memory 5 is too high. In this case, the learned values are buffer-stored in the volatile memory 4, which is supplied without interruption by the voltage source 8. The learning values are lost only when the chip temperature is too high and the control unit is disconnected from the supply voltage 8. This variant presupposes that the volatile data memory 4 has a low current consumption.

Figure 5:
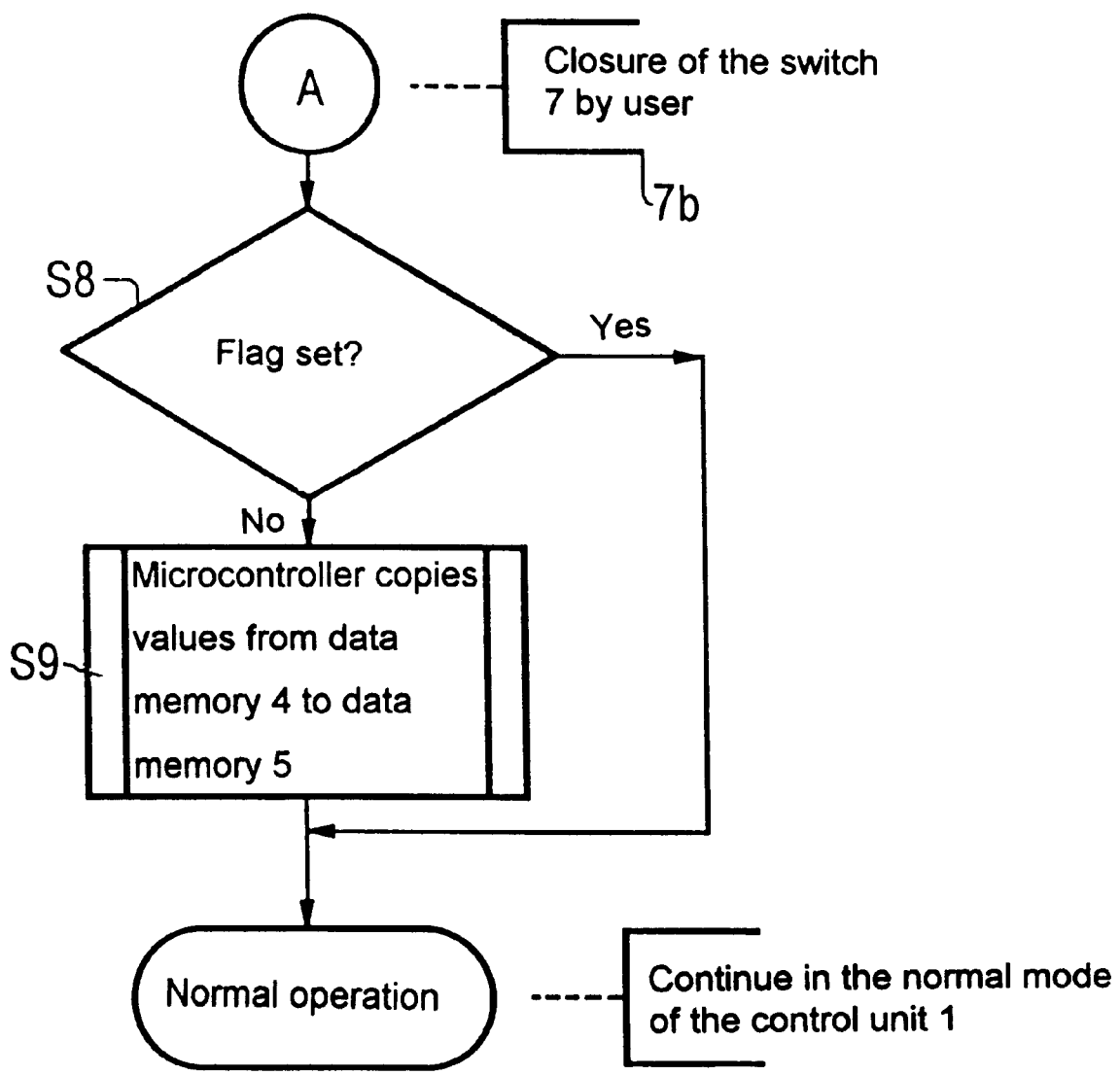

After the control unit 1 is switched on by closing the switch 7, which is indicated by a small box 7b in FIG. 5 and is established at the beginning A of the program, an interrogation is made in a step S8 to see whether or not the flag is set. If it is, then the program continues in the normal mode of the control unit. If the flag is not set, then, in a step S9, the microcontroller copies the values from the data memory 5 to the data memory 4. That is to say the copying back is suppressed when the switch 7 is closed.

Figure 6:
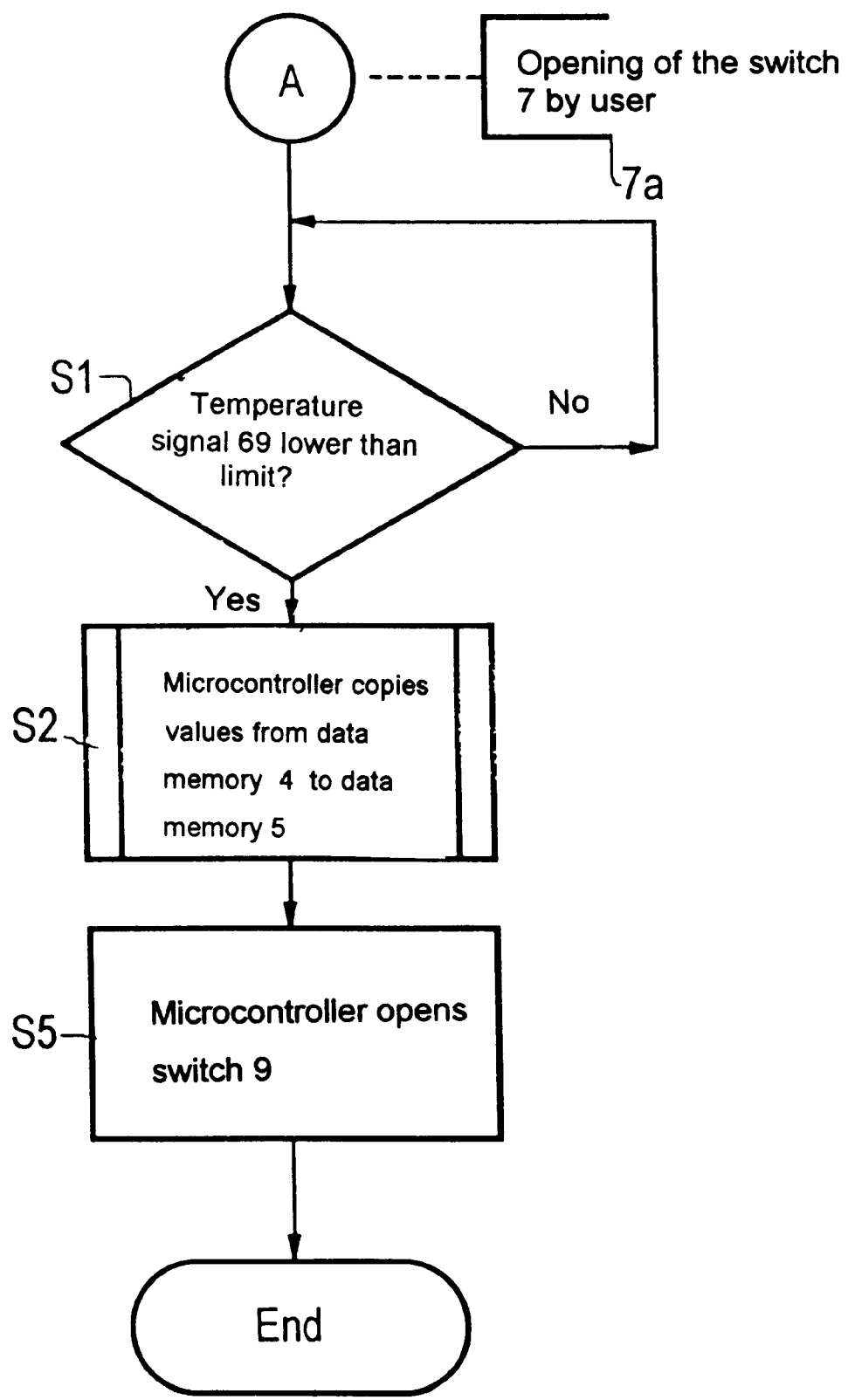

In a further exemplary embodiment of the control unit 1 according to the invention which is illustrated in FIG. 6, the operating voltage input 42 of the volatile data memory 4 is connected to the operating voltage supply point 92 which is connected internally within the control unit. The computer 3 first of all waits until the signal 69 of the temperature sensor 6 falls below the predetermined value $T_{max}$, then the computer carries out the copying operation, and finally opens the switch 9. In the step S1 shown in FIG. 6, an interrogation is also made in this case to see whether or not the temperature signal 69 is lower than the limit $T_{max}$. If the answer is no, the inter-rogation is repeated until the answer is yes. Afterwards, the copying operation which was already described is carried out in the step S2 and the microcontroller 3 subsequently opens the switch 9 in the step S5. The program is thus at its end. This exemplary embodiment has the advantage of being particularly simple to realize.

In another exemplary embodiment of the control unit 1, the copying operation that has been explained and the subsequent steps are started even when a predetermined time interval after the opening of the switch has been exceeded, that is to say after the control unit 1 has been switched off through the use of the switch 7 (or after the driver has switched the ignition off). This is executed even when the signal 69 of the temperature sensor 6 still exceeds the predetermined value $T_{max}$.

Figure 7:
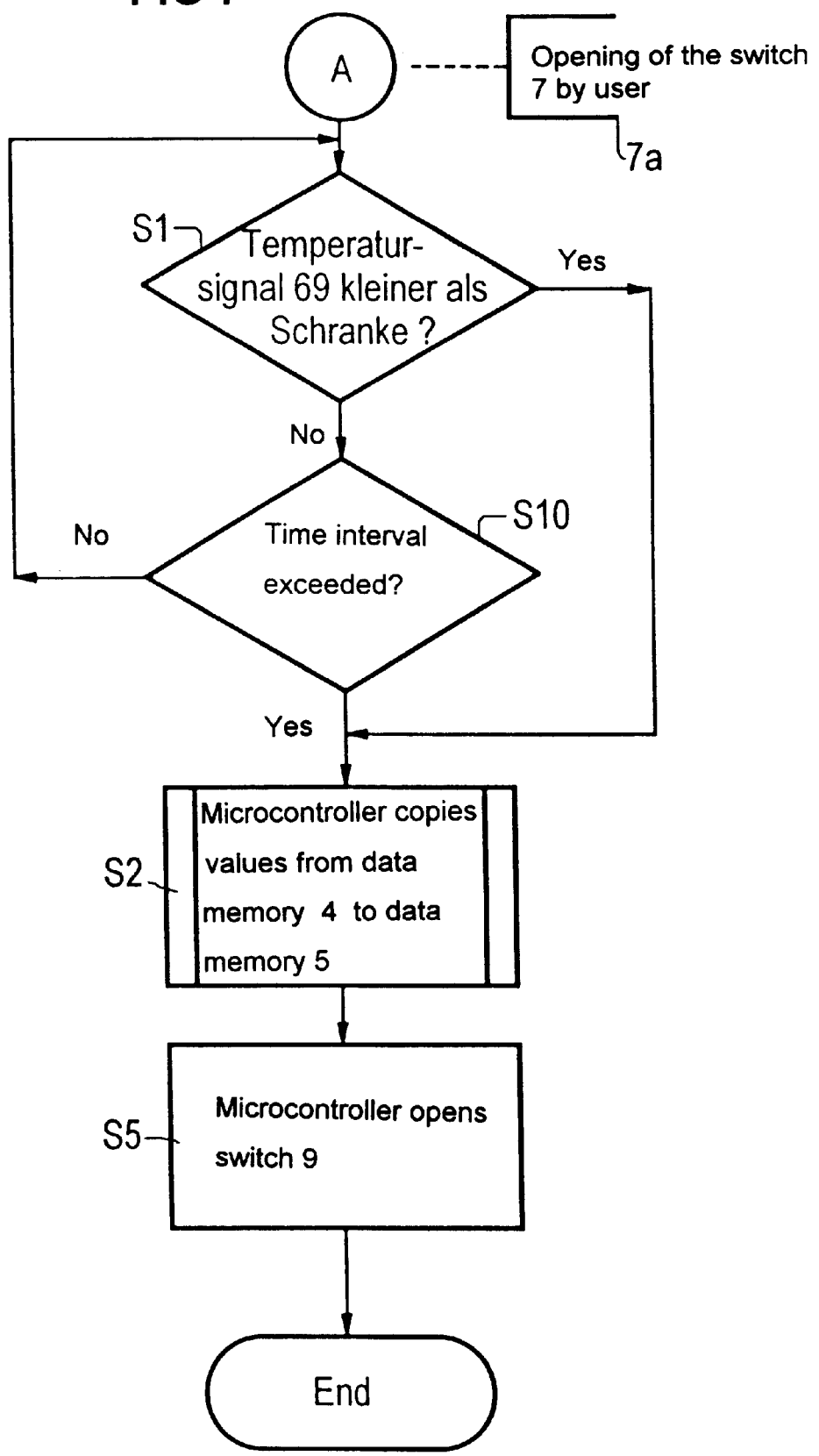

If the temperature interrogation in the step S1 according to FIG. 7 is answered in the affirmative, then the program continues with the step S2, that is to say with the copying operation from the data memory 4 to the data memory 5. If the interrogation is answered in the negative, then an interrogation is made in a step S10 to see whether or not the predetermined time interval has been exceeded. If the answer is yes, the program continues with the step S2. If the answer is no, the program jumps back to the start A of the program and the interrogation S1 is carried out anew. After the step S2, the program continues with the step S5, in which the microcontroller 3 opens the switch 9. The program in FIG. 7 has thus reached its end. This exemplary embodiment constitutes a safety variant of the control unit 1 for the case where the temperature sensor supplies an incorrect signal indicating a permanently excessively high temperature. This prevents continuous operation of the control unit 1 since the latter would otherwise wait without interruption for a lower temperature and, in the process, discharge the battery.

In the flow diagrams of FIGS. 2 to 7, the same program steps in the different programs have always been provided with the same reference symbols, for the sake of uniformity. The consequence of this is that the order of the program steps in some instances does not agree with their numbering, but the actual order is readily apparent from the figures and from the description given above.

I claim:

1. An electronic control unit, comprising:
   a first volatile data memory;
   a second nonvolatile data memory for receiving and storing variable data from said volatile data memory;
   a temperature sensor supplying information signaling a temperature of said nonvolatile data memory; and
   a computer receiving the temperature information from said temperature sensor, said computer copying data from said volatile data memory to said nonvolatile data memory only when the temperature signaled by said temperature sensor falls below a predetermined value, and data being read from said nonvolatile data memory up to an upper temperature limit lying above said predetermined value.

2. The control unit according to claim 1, wherein data are copied cyclically from said volatile data memory to said nonvolatile data memory during normal operation of the control unit.

3. The control unit according to claim 1, including a switch to be opened by a user of the electronic control unit for enabling said computer to copy data from said volatile data memory to said nonvolatile data memory.

4. The control unit according to claim 3, wherein said switch is subsequently closed for suppressing copying of values back from said nonvolatile data memory to said volatile data memory.

5. The control unit according to claim 1, including a supply voltage source, said volatile data memory having an operating voltage input connected to said supply voltage source, and a switch opened by said computer after copying has taken place or if a signal of said temperature sensor has exceeded said predetermined value.

6. The control unit according to claim 1, wherein said predetermined value corresponds to a maximum permissible erasure and writing temperature for said nonvolatile data memory.

7. The control unit according to claim 1, including:
   an internal operating voltage supply;
   an operating voltage input of said volatile data memory connected to said operating voltage supply;
   a supply voltage source for said computer; and
   a switch connected to said computer and to said supply voltage source for internally disconnecting said supply voltage source with a command from said computer;
   said computer opening said switch after the temperature signaled by said temperature sensor has fallen below said predetermined value and after the data have been copied from said volatile data memory to said nonvolatile data memory.

8. The control unit according to claim 7, wherein said supply voltage source also supplies said volatile data memory and said nonvolatile data memory, and said switch internally disconnects said supply voltage source from said volatile data memory and said nonvolatile data memory with a command from said computer.

9. A motor vehicle device having an electronic control unit, comprising:
   a volatile data memory;
   a nonvolatile data memory for receiving and storing variable data from said volatile data memory;
   a temperature sensor supplying information signaling a temperature of said nonvolatile data memory; and
   a computer receiving the temperature information from said temperature sensor, said computer copying data from said volatile data memory to said nonvolatile data memory only when the temperature signaled by said temperature sensor falls below a predetermined value, and data being read from said nonvolatile data memory up to an upper temperature limit lying above said predetermined value.

* * * * *